United States Patent
Johnson et al.

(10) Patent No.: US 6,963,243 B2
(45) Date of Patent: Nov. 8, 2005

(54) AMPLIFIER PRE-DISTORTION PROCESSING BASED ON COMPOSITE LOOK-UP TABLES

(75) Inventors: Robert E. Johnson, Randolph, NJ (US); Ruikang Yang, Bridgewater, NJ (US)

(73) Assignee: Andrew Corporation, Orland Park, IL (US)

( * ) Notice: Subject to any disclaimer, the term of this patent is extended or adjusted under 35 U.S.C. 154(b) by 4 days.

(21) Appl. No.: 10/691,232

(22) Filed: Oct. 22, 2003

(65) Prior Publication Data

US 2005/0088230 A1 Apr. 28, 2005

(51) Int. Cl.[7] .............................................. H03F 1/26
(52) U.S. Cl. ...................................... 330/149; 375/297
(58) Field of Search ................................ 330/149, 151; 375/297; 455/63

(56) References Cited

U.S. PATENT DOCUMENTS

| | | | |
|---|---|---|---|
| 4,968,968 A | 11/1990 | Taylor | 342/174 |
| 5,307,022 A | 4/1994 | Tattersall, Jr. et al. | 330/52 |
| 5,923,712 A | 7/1999 | Leyendecker et al. | 375/297 |
| 5,949,283 A | 9/1999 | Proctor et al. | 330/149 |
| 5,959,500 A | 9/1999 | Garrido | 330/151 |
| 6,587,514 B1 | 7/2003 | Wright et al. | 375/296 |
| 6,646,501 B1 * | 11/2003 | Wessel | 330/10 |
| 6,794,936 B2 * | 9/2004 | Hsu et al. | 330/149 |
| 6,794,939 B2 * | 9/2004 | Kim et al. | 330/149 |
| 6,812,792 B2 * | 11/2004 | Mattsson et al. | 330/149 |
| 2002/0186783 A1 | 12/2002 | Opas et al. | 375/297 |
| 2002/0193085 A1 | 12/2002 | Mathe et al. | 455/126 |
| 2003/0053552 A1 | 3/2003 | Hongo et al. | 375/295 |
| 2003/0107434 A1 | 6/2003 | Mitzlaff | 330/149 |
| 2003/0125065 A1 | 7/2003 | Barak et al. | 455/522 |

* cited by examiner

*Primary Examiner*—Henry Choe
(74) *Attorney, Agent, or Firm*—Steve Mendelsohn

(57) ABSTRACT

Current and previous input signal power measures are used to generate a combined index value that is applied to one or more composite look-up tables (e.g., an I LUT and a Q LUT) to retrieve one or more pre-distortion parameters (e.g., I and Q). In one embodiment, a combined index value is generated by concatenating current and previous power measures, where each composite LUT maps all possible combinations of the current and previous power measures to the corresponding pre distortion parameters values. By using a composite LUT for each of I and Q, the overall signal processing time of the pre-distortion processing can be greatly reduced relative to the prior art, resulting in a significantly smaller RF delay line used to delay the input signal and thereby providing a less costly and more efficient amplifier system.

24 Claims, 5 Drawing Sheets

US 6,963,243 B2

AMPLIFIER PRE-DISTORTION PROCESSING BASED ON COMPOSITE LOOK-UP TABLES

FIELD OF THE INVENTION

The present invention relates to signal processing, and, in particular, to techniques for linearizing amplifiers based on pre-compensation.

BACKGROUND OF THE INVENTION

Amplifiers, such as high-power amplifiers used in the base stations of wireless communication systems, typically exhibit non-linearity over their operating ranges. This non-linearity can result in noise that can corrupt or otherwise interfere with the communications. To address this problem, additional circuitry may be added to an amplifier in an attempt to linearize the effective amplifier response. Conventional techniques for linearizing amplifiers typically involve pre-compensation and/or feed-forward compensation.

In amplifier linearization based on pre-compensation, the input signal that is to be amplified is pre-distorted prior to being applied to the amplifier in order to adjust the input signal based on known non-linearities in the amplifier transfer function. In feed-forward compensation, an auxiliary signal is fed forward and combined with the output of the amplifier to adjust the output signal for non-linearities in the amplifier transfer function.

FIG. 1 shows a high-level block diagram of prior art amplifier system 100, which is linearized using pre-compensation. In particular, a sample of an RF input signal x(t) is applied to envelope detector 102, which generates a voltage representative of the instantaneous envelope power level of the input signal. This analog power signal p(t) is digitized by analog-to-digital converter (ADC) 104. The resulting digital power signal p(n) is applied to pre-distorter 106, which generates a pre-distorted signal in the form of digital pre-distortion component signals I(n) and Q(n). These digital pre-distortion signals I(n) and Q(n) are converted to analog pre-distortion signals I(t) and Q(t) by digital-to-analog converters (DACs) 108. The analog pre-distortion signals I(t) and Q(t) are used by vector modulator 110 to modulate a delayed version of the RF input signal x(t) delayed by delay line 114 to generate a pre-distorted RF signal y(t) that is then input to amplifier 112, which generates an amplified RF output signal z(t). The purpose of RF delay line 114 is to compensate for the processing time of elements 102–108 to ensure that vector modulator 110 uses appropriately time-aligned pre-distortion signals I(t) and Q(t) to modulate the RF input signal x(t). (Although FIG. 1 shows pre-distortion being applied to the input signal in the analog domain using a vector modulator, in alternative embodiments, pre-distortion can be applied to a baseband representation of the input signal in the digital domain.)

Delaying RF signals can be expensive (e.g., about $1 for each nanosecond of delay). As such, one of the goals in implementing amplifier system 100 is to reduce the overall processing time of elements 102–108 to keep the delay required to be imparted by RF delay line 114 as small as possible. Moreover, the larger the delay line, the greater the attenuation of the RF signal. As such, gain is typically added to the amplifier to account for this attenuation, resulting in further cost and increased distortion.

BRIEF DESCRIPTION OF THE DRAWINGS

Aspects, features, and advantages of the present invention will become more fully apparent from the following detailed description, the appended claims, and the accompanying drawings in which like reference numerals identify similar or identical elements.

DETAILED DESCRIPTION

Figure 1:
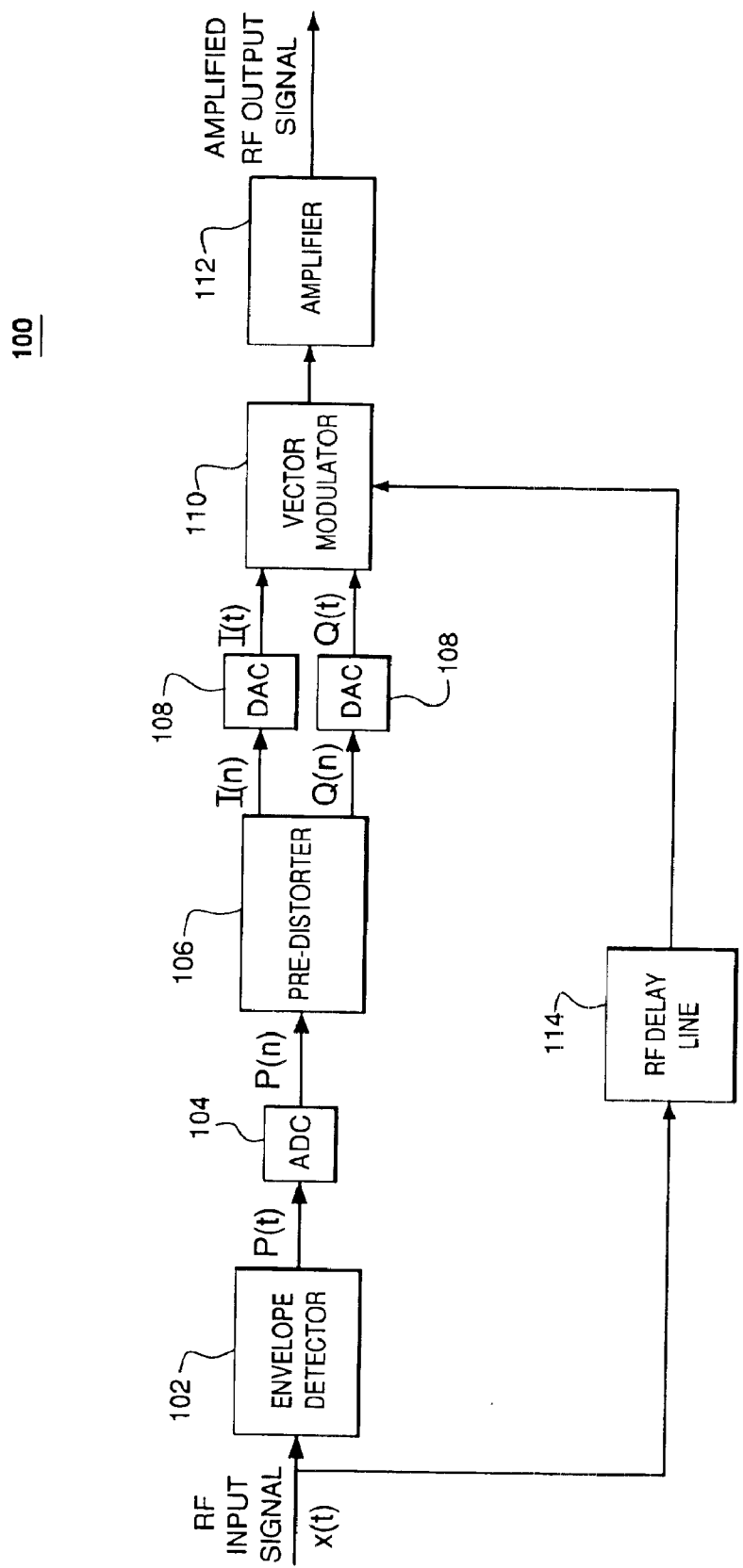
FIG. 1 shows a high-level block diagram of a prior art amplifier system that is linearized using pre-compensation.
Figure 2:
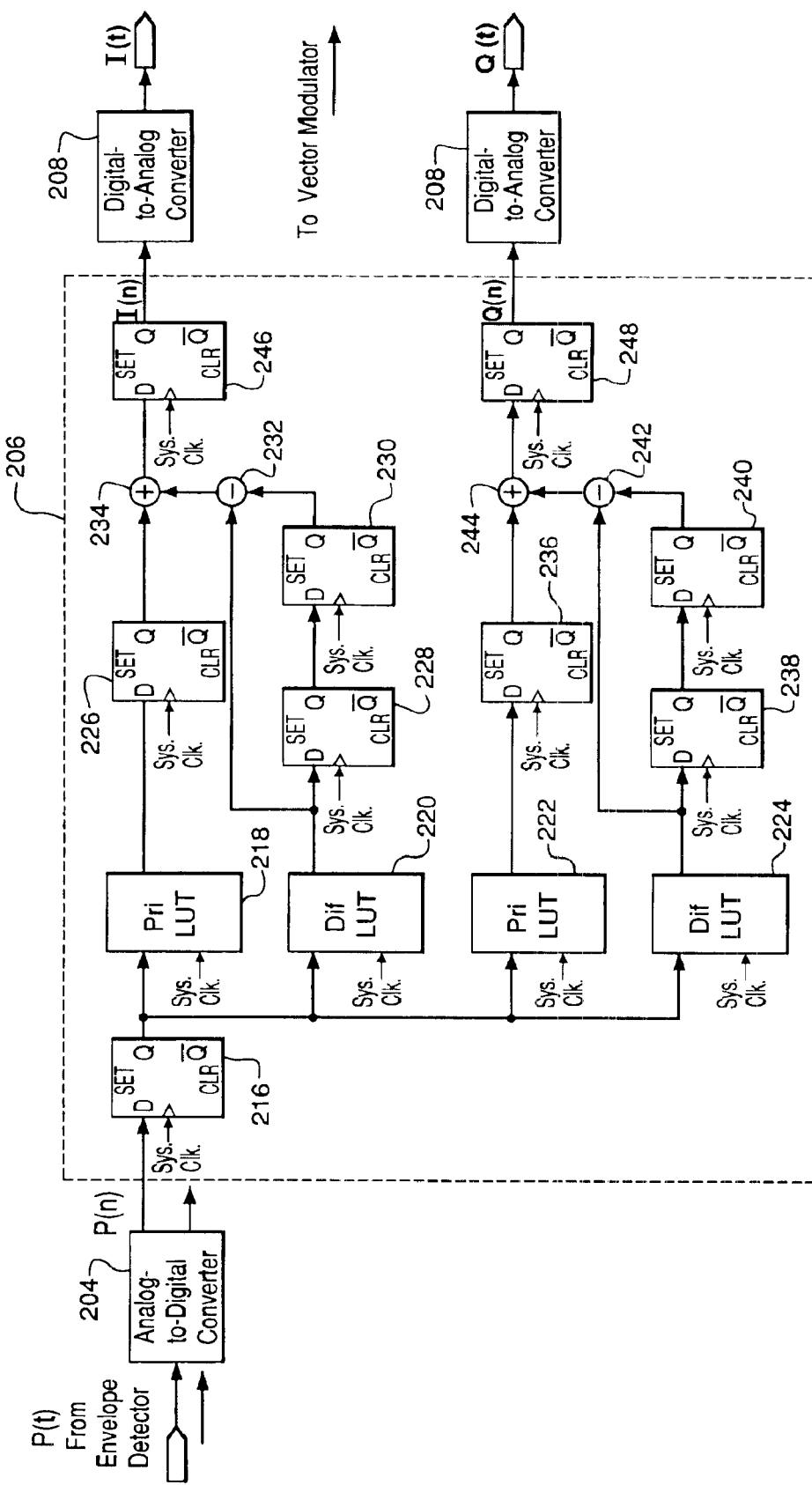
FIG. 2 shows a block diagram of a pre-distorter that can be used to implement the pre-distorter of FIG. 1.

FIG. 2 shows a block diagram of prior art pre-distorter 206, which can be used to implement the pre-distorter of FIG. 1. In particular, FIG. 2 shows ADC 204 (similar to ADC 104 of FIG. 1) receiving an analog voltage signal p(t) generated by an envelope detector (similar to envelope detector 102 of FIG. 1) and generating a digital signal p(n) corresponding to that received voltage and representative of the instantaneous RF envelope power level. The digital power signal p(n) is applied to pre-distorter 206, which generates two digital pre-distortion components I(n) and Q(n), each of which is applied to a DAC 208 (similar to DACs 108 of FIG. 1) to generate analog pre-distortion signals I(t) and Q(t) that are applied to a vector modulator (similar to vector modulator 110 of FIG. 1) to generate a pre-distorted signal for amplification by an amplifier (similar to amplifier 112 of FIG. 1).

Pre-distorter 206 of FIG. 2 may be implemented in a field-programmable gate array (FPGA) or other suitable processor. As shown in FIG. 2, pre-distorter 206 has input delay module 216 (e.g., a flip flop), which is an optional part of the FPGA's I/O circuitry. The envelope power signal from module 216 is applied in parallel to primary I look-up table (LUT) 218, differential I LUT 220, primary Q LUT 222, and differential Q LUT 224, each of which stores a different set of digital pre-distortion parameter values (i.e., correction coefficients) that are initially derived using off-line calibration procedures under different operating conditions. Primary LUTs 218 and 222 preferably store frequency-independent I and Q pre-distortion parameters (also referred to as "layer 1" parameters), respectively, while differential LUTs 220 and 224 preferably store frequency-dependent I and Q pre-distortion parameters (also referred to as "layer 2" parameters), respectively. The envelope power signal p(n) is used as an index to retrieve corresponding pre-distortion parameters from the LUTs.

Delay modules 226, 228, and 230, difference node 232, and summation node 234 are designed to generate a digital pre-distortion component I(n) according to Equation (1) as follows:

$$I(n) = I_{p1}(p(n)) + (I_{d1}(p(n+1)) - I_{d1}(p(n-1))) \qquad (1)$$

where $I_{p1}(p(n))$ is the primary I pre-distortion parameter from LUT 218 for the current power sample p(n), $I_{d1}(p(n-1))$ is the differential I pre-distortion parameter from LUT 220 for the previous power sample p(n−1), and $I_{d1}(p(n+1))$ is the differential I pre-distortion parameter from LUT 220 for the next power sample p(n+1).

Similarly, delay modules 236, 238, and 240, difference node 242, and summation node 244 are designed to generate a digital pre-distortion component Q(n) according to Equation (2) as follows:

$$Q(n) = Q_{p1}(p(n)) + (Q_{d1}(p(n+1)) - Q_{d1}(p(n-1))) \qquad (2)$$

where $Q_{p1}(p(n))$ is the primary Q pre-distortion parameter from LUT 222 for the current power sample, $Q_{d1}(p(n-1))$ is the differential Q pre-distortion parameter from LUT 224 for the previous power sample, and $Q_{d1}(p(n+1))$ is the differential Q pre-distortion parameter from LUT 224 for the next power sample.

The purpose of delay nodes 226–230 and 236–240 is to properly align the various pre-distortion parameters in time to implement the desired equations.

The resulting pre-distortion components I(n) and Q(n) are applied to output delay modules 246 and 248, which are optional parts of the FPGA's I/O circuitry, and converted to analog pre-distortion signals I(t) and Q(t) by DACs 208 for application to the vector modulator.

Due to the time delays caused by signal processing, the circuitry of FIG. 2 adds a delay between the ADC and the DACs. Implementing an RF delay line, such as RF delay line 114, to compensate for such delays can be prohibitively expensive.

Figure 3:
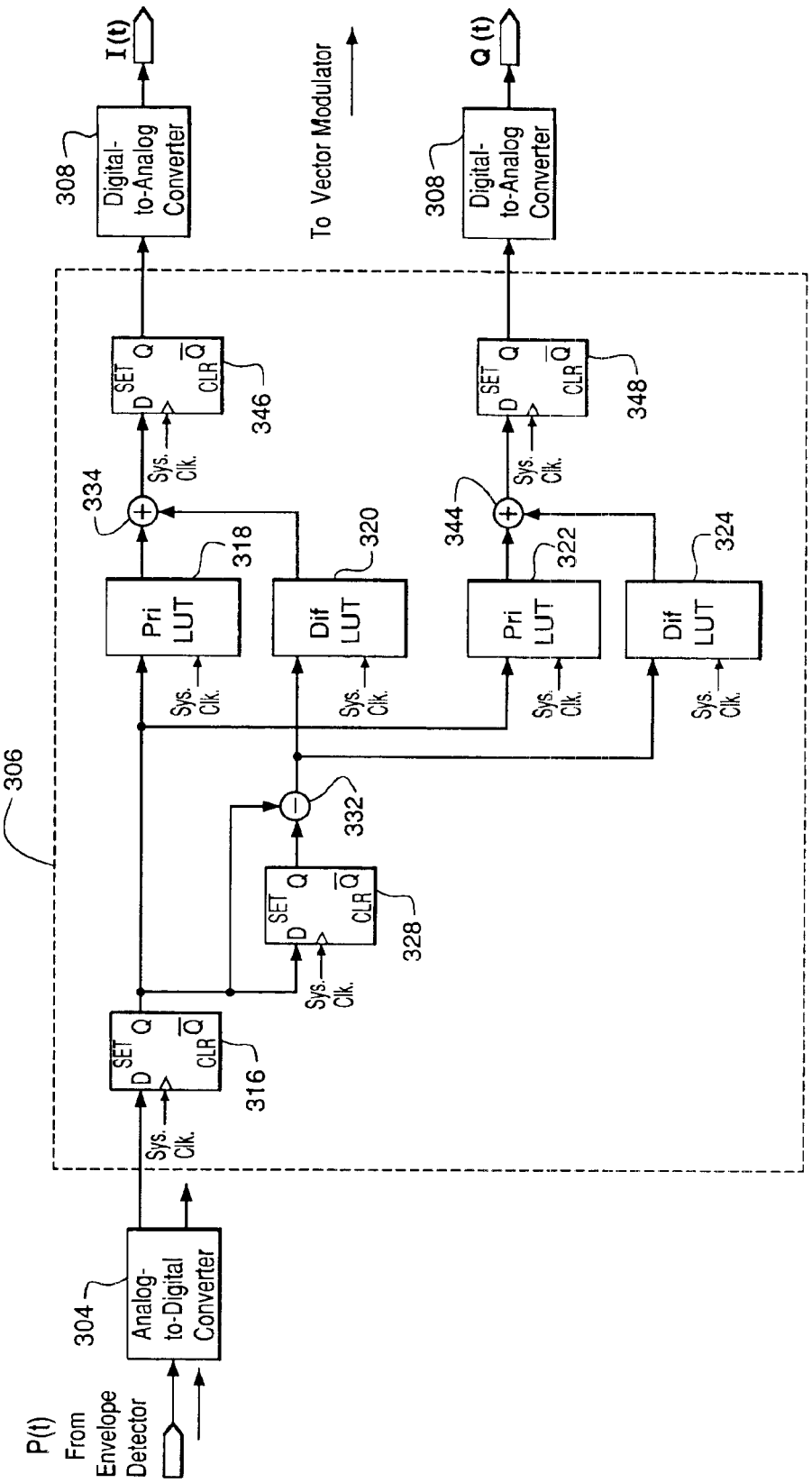
FIG. 3 shows a block diagram of an alternative pre-distorter that can be used to implement the pre-distorter of FIG. 1.

FIG. 3 shows a block diagram of alternative pre-distorter 306, which can be used to implement the pre-distorter of FIG. 1 with a smaller delay. In particular, FIG. 3 shows ADC 304 receiving an analog voltage signal p(t) generated by an envelope detector and generating a digital signal p(n) corresponding to that received voltage and representative of the instantaneous RF envelope power level. The digital power signal p(n) is applied to pre-distorter 306, which generates two digital pre-distortion components I(n) and Q(n), each of which is applied to a DAC 308 to generate analog pre-distortion signals I(t) and Q(t) that are applied to a vector modulator to generate a pre-distorted signal for application to an amplifier.

Like pre-distorter 206 of FIG. 2, pre-distorter 306 has input delay module 316 and two output delay modules 346 and 348, which are optional parts of the FPGA's I/O circuitry. In addition, like pre-distorter 206, pre-distorter 306 has primary and differential LUTs 318–324 that store (frequency-dependent and frequency-independent) pre-distortion parameter values.

Unlike pre-distorter 206, which has circuitry that implements Equations (1) and (2), however, pre-distorter 306 has circuitry that implements Equations (3) and (4) as follows:

$$I(n) = I_{p2}(p(n)) + I_{d2}(p(n) - p(n-1)) \qquad (3)$$

$$Q(n) = Q_{p2}(p(n)) + Q_{d2}(p(n) - p(n-1)) \qquad (4)$$

where $I_{p2}(p(n))$ is the primary I pre-distortion parameter from LUT 318 for the current power sample, $I_{d2}(p(n)-p(n-1))$ is the differential I pre-distortion parameter from LUT 320 for the difference between the current power sample and the previous power sample, $Q_{p2}(p(n))$ is the primary Q pre-distortion parameter from LUT 322 for the current power sample, and $Q_{d2}(p(n)-p(n-1))$ is the differential Q pre-distortion parameter from LUT 324 for the difference between the current power sample and the previous power sample. Note that, while the pre-distortion parameter data stored in primary LUTs 318 and 322 will typically be identical to that stored in primary LUTs 218 and 222 of FIG. 2, differential LUTs 320 and 324 will store I and Q parameter data that differs from differential LUTs 220 and 224 of FIG. 2, since LUTs 320 and 324 are indexed using power differences.

Pre-distorter 306 has delay 328 and difference node 332, which generate the difference between the current power sample p(n) and the previous power sample p(n−1). This difference is applied to the I and Q differential LUTs 320 and 324. Pre-distorter 306 also has summation nodes 334 and 344, which sum the outputs of the two I LUTs and the outputs of the two Q LUTs, respectively.

Comparing FIGS. 2 and 3, pre-distorter 306 is implemented using two fewer delay elements, with one fewer delay element in each of the I and Q processing paths. As a result, the overall processing time for pre-distorter 306 can be less than the overall processing time for pre-distorter 206 of FIG. 2, resulting in a less expensive RF delay line for the amplifier system. The shorter overall processing time can provide improved performance, e.g., for applications in which reducing signal latency is advantageous.

Although pre-distorter 306 of FIG. 3 has summation nodes 334 and 344, an analogous pre-distorter can be implemented using difference nodes by storing data having opposite signs in the appropriate LUTs.

Figure 4:
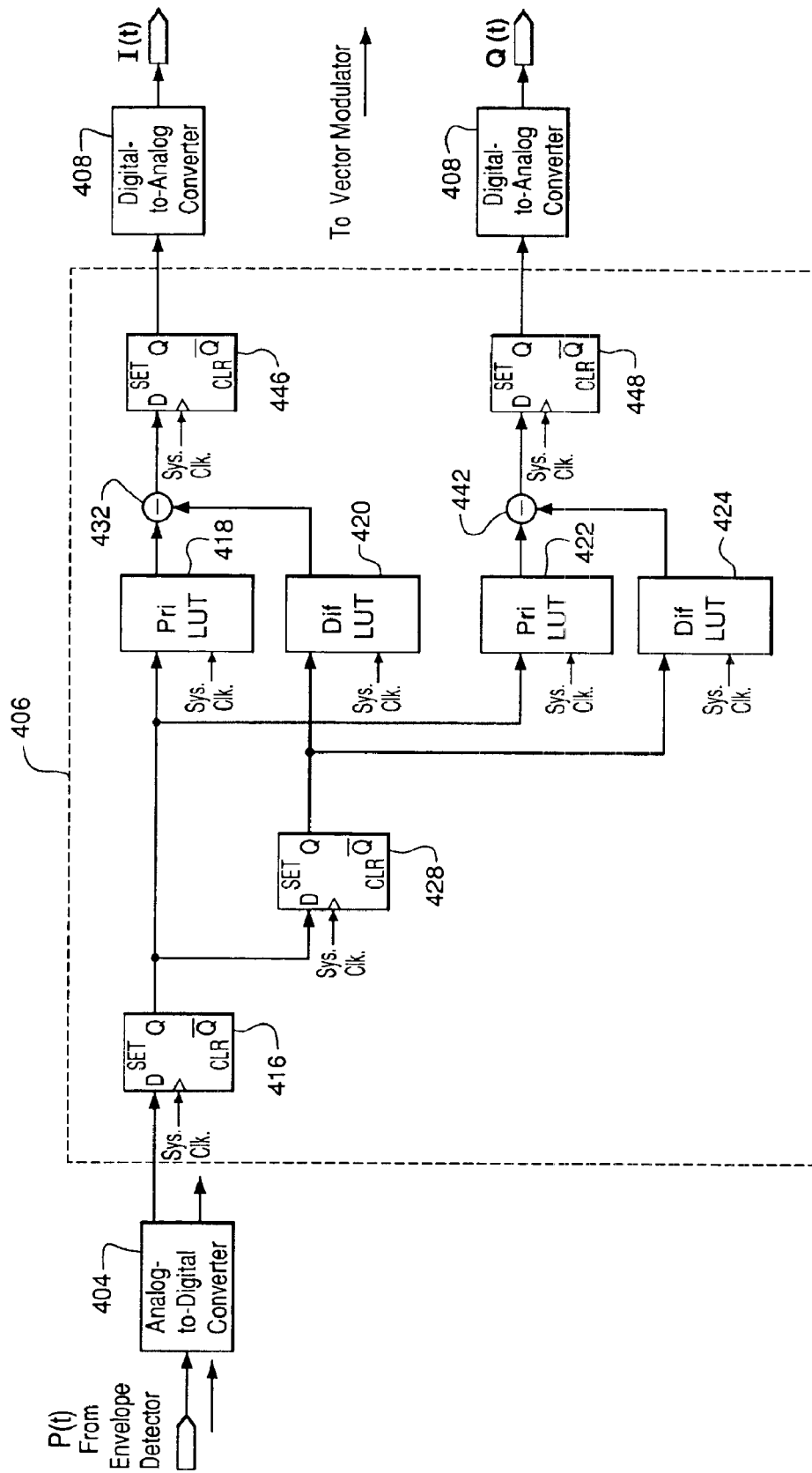
FIG. 4 shows a block diagram of another alternative pre-distorter that can be used to implement the pre-distorter of FIG. 1.

FIG. 4 shows a block diagram of another alternative pre-distorter 406, which can be used to implement the pre-distorter of FIG. 1. In particular, FIG. 4 shows ADC 404 receiving an analog voltage signal p(t) generated by an envelope detector and generating a digital signal p(n) corresponding to that received voltage and representative of the instantaneous RF envelope power level. The digital power signal p(n) is applied to pre-distorter 406, which generates two digital pre-distortion components I(n) and Q(n), each of which is applied to a DAC 408 to generate analog pre-distortion signals I(t) and Q(t) that are applied to a vector modulator to generate a pre-distorted signal for application to an amplifier.

Like pre-distorter 206 of FIG. 2 and pre-distorter 306 of FIG. 2, pre-distorter 406 has input delay module 416 and two output delay modules 446 and 448, which are optional parts of the FPGA's I/O circuitry. In addition, like pre-distorter 206 and pre-distorter 306, pre-distorter 406 has primary and differential LUTs 418–424 that store pre-distortion parameter values.

Unlike pre-distorter 206, which has circuitry that implements Equations (1) and (2), and pre-distorter 306, which has circuitry that implements Equations (3) and (4), however, pre-distorter 406 has circuitry that implements Equations (5) and (6):

$$I(n) = I_{p3}(p(n)) - I_{d3}(p(n-1)) \qquad (5)$$

$$Q(n) = Q_{d3}(p(n)) - Q_{d3}(p(n-1)) \qquad (6)$$

where $I_{p3}(p(n))$ is the primary I pre-distortion parameter from LUT 418 for the current power sample, $I_{d3}(p(n-1))$ is the differential I pre-distortion parameter from LUT 420 for the previous power sample, $Q_{p3}(p(n))$ is the primary Q pre-distortion parameter from LUT 422 for the current power sample, and $Q_{d3}(p(n-1))$ is the differential Q pre-distortion parameter from LUT 424 for the previous power sample. As before, the pre-distortion parameter data stored in these LUTs may differ from the data stored in the LUTs of the other embodiments.

Pre-distorter 406 has delay 428 and difference nodes 432 and 442, which generate the differences between the primary I and Q pre-distortion parameters for the current power sample p(n) and the differential I and Q pre-distortion parameters for the previous power sample p(n−1), respectively.

Comparing FIGS. 3 and 4, pre-distorter 306 is implemented using one difference node (332) and two summation nodes (334 and 344), while pre-distorter 406 is implemented using two difference nodes (432 and 442) and no summation nodes. In addition, to using one fewer node, pre-distorter 406 has one less difference/summation operation in each of the I and Q processing paths. As a result, the overall processing time for pre-distorter 406 can be less than the overall processing time for pre-distorter 306, resulting in an even less expensive RF delay line for the amplifier system. As before, the shorter overall processing time can provide improved performance, e.g., for applications in which reducing signal latency is advantageous.

Although pre-distorter 406 of FIG. 4 has difference nodes 432 and 442, an analogous pre-distorter can be implemented using summation nodes by storing data having opposite signs in the appropriate LUTs.

Equations (5) and (6) and the architecture of FIG. 4 enable a RAM-based implementation as opposed to the FPGA-based implementations of FIGS. 2–4.

Figure 5:
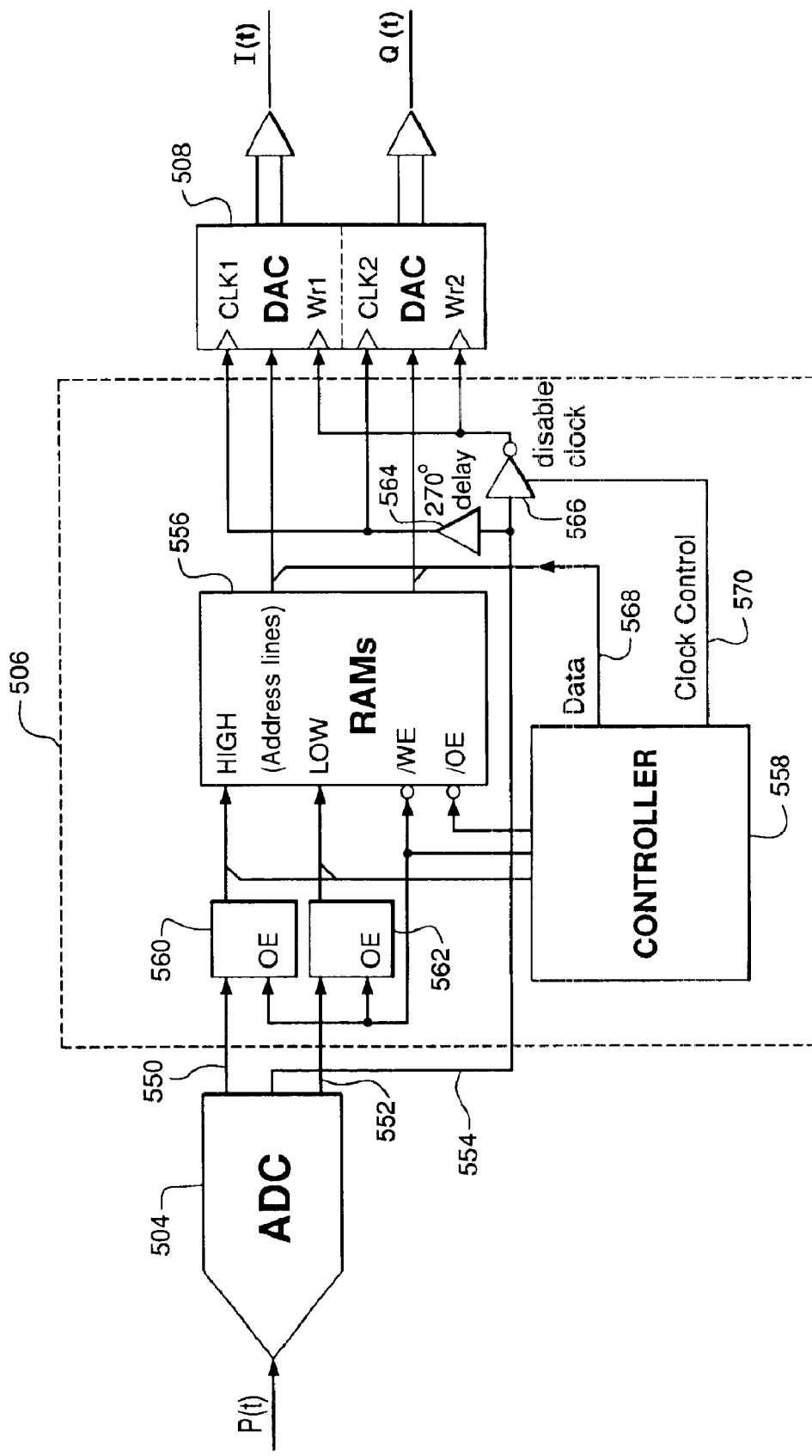
FIG. 5 shows a block diagram of a RAM-based pre-distorter that can be used to implement the pre-distorter of FIG. 1.

FIG. 5 shows a block diagram of a RAM-based pre-distorter 506, which can be used to implement the pre-distorter of FIG. 1. In particular, FIG. 5 shows ADC 504, which receives an analog voltage signal p(t) generated by an envelope detector and outputs two digital values, one (550) corresponding to current RF envelope power level p(n) and the other (552) corresponding to the previous RF envelope power level p(n−1). In one implementation, ADC 504 is designed to output the current and previous samples at every ADC operating cycle. In addition, ADC 504 outputs a clock signal 554 that is applied to activate DACs 508.

At the heart of pre-distorter 506 are two single-port asynchronous RAMs 556, one for storing I pre-distortion parameters in a single, composite I LUT and one for storing Q pre-distortion parameters in a single, composite Q LUT. According to this implementation, each composite LUT receives a single combined index value, where half of the bits correspond to the current digital power level p(n) from ADC 504 and the remaining bits correspond to the previous digital power level p(n−1) from ADC 504, where the two power levels are concatenated or appended together to form the combined index. In essence, each composite LUT maps all possible combinations of consecutive power levels to the corresponding pre-distortion parameters, thereby avoiding the need for any additional computational circuitry, such as that shown in FIGS. 2–4. In particular, for m-bit current and previous power levels, RAM-based LUTs 556 map $2^{2m}$ different combined indices to corresponding I(n) and Q(n) pre-distortion components.

These I(n) and Q(n) pre-distortion signals are applied to DACs 508 to generate analog pre-distortion signals I(t) and Q(t) that are applied to a vector modulator to generate a pre-distorted signal for application to an amplifier.

In addition, pre-distorter 506 has controller 558, switches 560 and 562, delay 564, and inverter 566, which enable RAMs 556 to be loaded with I and Q pre-distortion parameter values during initialization and possibly during intermittent dynamic LUT updating. In particular, to load RAMs 556, controller 558 disables switches 560 and 562 to prevent the ADC outputs from reaching RAMs 556. At the same time, controller 558 configures RAMs 556 to receive I and Q pre-distortion parameter values via data line 568, while clock control line 570 disables DACs 508.

Depending on the particular implementation, controller 558 may be a DSP, a CPLD, an FPGA, or any other suitable processing device. Switches 560 and 562 may be implemented using FET switches, and RAMs 556 may be implemented using two asynchronous RAMs.

The implementation of FIG. 5 is capable of a significant reduction in the total processing time of pre-distorter 506 and thus a significant reduction in the cost of implementing such an amplifier system.

In each of the implementations shown in FIGS. 2–5, the DACs could be replaced with digital modulators.

The present invention may be implemented in the context of wireless signals transmitted from a base station to one or more mobile units of a wireless communication network. In theory, embodiments of the present invention could be implemented for wireless signals transmitted from a mobile unit to one or more base stations. The present invention can also be implemented in the context of other wireless and even wired communication networks to reduce spurious emissions.

Embodiments of the present invention may be implemented as circuit-based processes, including possible implementation on a single integrated circuit (such as an ASIC or an FPGA), a multi-chip module, a single card, or a multi-card circuit pack. As would be apparent to one skilled in the art, various functions of circuit elements may also be implemented as processing steps in a software program. Such software may be employed in, for example, a digital signal processor, micro-controller, or general-purpose computer.

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. A method for processing an input signal for application to an amplifier to generate an amplified output signal, the method comprising:

generating a measure characterizing previous power of the input signal;

generating a measure characterizing current power of the input signal;

generating a combined index value from the current and previous power measures;

applying the combined index value to one or more look-up tables (LUTs) to retrieve one or more pre-distortion parameters;

applying the one or more pre-distortion parameters to the input signal to generate a pre-distorted input signal for application to the amplifier.

2. The invention of claim 1, further comprising amplifying the pre-distorted input signal using the amplifier to generate the amplified output signal.

3. The invention of claim 1, wherein:

the current power measure is a measure of instantaneous envelope power of the input signal; and the previous power measure is the measure of the instantaneous envelope power of the input signal from a previous processing cycle.

4. The invention of claim 1, wherein the combined index value corresponds to a concatenation of the current and previous power measures.

5. The invention of claim 4, wherein each LUT maps all possible combinations of the current and previous power measures.

6. The invention of claim 1, wherein the combined index value corresponds to a concatenation of the current power measure and a difference between the current and previous power measures.

7. The invention of claim 6, wherein each LUT maps all possible combinations of the current power measure and the power measure difference.

8. The invention of claim 1, wherein each LUT is stored in a RAM where the combined index value is applied to each RAM to retrieve one of the one or more pre-distortion parameters.

9. The invention of claim 1, wherein the one or more LUTs comprises a composite I LUT and a composite Q LUT.

10. The invention of claim 9, wherein the pre-distorted input signal is generated by applying the input signal and I and Q pre-distortion parameters retrieved from the composite I and Q LUTs to a vector modulator.

11. An apparatus for processing an input signal for application to an amplifier to generate an amplified output signal, the apparatus comprising:
- a power detector adapted to generate a measure characterizing power of the input signal;
- one or more look-up tables (LUTs) adapted to provide one or more pre-distortion parameters, wherein each LUT is adapted to receive a combined index value generated based on a current input signal power measure and a previous input signal power measure; and
- a modulator adapted to apply the one or more pre-distortion parameters to the input signal to generate a pre-distorted input signal for application to the amplifier.

12. The invention of claim 11, further comprising the amplifier adapted to amplify the pre-distorted input signal to generate the amplified output signal.

13. The invention of claim 11, wherein the power detector is adapted to measure instantaneous envelope power of the input signal.

14. The invention of claim 13, further comprising an analog-to-digital converter (ADC) adapted to convert an analog power measure from the power detector into a digital power measure.

15. The invention of claim 14, wherein the ADC is adapted to output a current digital power measure and a previous digital power measure at every operating cycle.

16. The invention of claim 11, wherein the combined index value corresponds to a concatenation of the current and previous power measures.

17. The invention of claim 16, wherein each LUT maps all possible combinations of the current and previous power measures.

18. The invention of claim 11, wherein the combined index value corresponds to a concatenation of the current power measure and a difference between the current and previous power measures.

19. The invention of claim 18, wherein each LUT maps all possible combinations of the current power measure and the power measure difference.

20. The invention of claim 11, wherein each LUT is stored in a RAM where the combined index value is applied to each RAM to retrieve one of the one or more pre-distortion parameters.

21. The invention of claim 1, wherein the one or more LUTs comprises a composite I LUT and a composite Q LUT.

22. The invention of claim 21, wherein the modulator is a vector modulator adapted to apply I and Q pre-distortion parameters retrieved from the composite I and Q LUTs to the input signal to generate the pre-distorted input signal.

23. The invention of claim 11, wherein:
- the power detector is adapted to measure instantaneous envelope power of the input signal;
- further comprising an analog-to-digital converter (ADC) adapted to convert an analog power measure from the power detector into a digital power measure, wherein the ADC is adapted to output a current digital power measure and a previous digital power measure at every operating cycle;
- the combined index value corresponds to a concatenation of the current and previous power measures;
- each LUT maps all possible combinations of the current and previous power measures;
- each LUT is stored in a RAM where the combined index value is applied to each RAM to retrieve one of the one or more pre-distortion parameters;
- the one or more LUTs comprises a composite I LUT and a composite Q LUT; and
- the modulator is a vector modulator adapted to apply I and Q pre-distortion parameters retrieved from the composite I and Q LUTs to the input signal to generate the pre-distorted input signal.

24. The invention of claim 23, further comprising the amplifier adapted to amplify the pre-distorted input signal to generate the amplified output signal.

* * * * *